United States Patent
Van Der Koijk et al.

(10) Patent No.: US 8,593,145 B2
(45) Date of Patent: Nov. 26, 2013

(54) MAGNETIC RESONANCE SYSTEM WITH COOLING SYSTEM AND MONITORING OF HELIUM PRESSURE

(75) Inventors: Johannes Ferdinand Van Der Koijk, Eindhoven (NL); Gerardus Bernardus Jozef Mulder, Eindhoven (NL); Paul Royston Harvey, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 657 days.

(21) Appl. No.: 12/746,780

(22) PCT Filed: Dec. 8, 2008

(86) PCT No.: PCT/IB2008/055136
§ 371 (c)(1),
(2), (4) Date: Jun. 8, 2010

(87) PCT Pub. No.: WO2009/074939
PCT Pub. Date: Jun. 18, 2009

(65) Prior Publication Data
US 2010/0253334 A1    Oct. 7, 2010

(30) Foreign Application Priority Data
Dec. 11, 2007    (EP) .................................... 07122834

(51) Int. Cl.
*G01V 3/00*    (2006.01)

(52) U.S. Cl.
USPC ............................................ 324/318; 324/319

(58) Field of Classification Search
USPC ........................... 324/300–322; 600/407–445
See application file for complete search history.

(56) References Cited

U.S. PATENT DOCUMENTS

| | | | |
|---|---|---|---|
| 6,516,282 B2 | 2/2003 | Hedlund et al. | |
| 6,793,975 B2 * | 9/2004 | Hunt et al. | 427/446 |
| 7,123,011 B2 | 10/2006 | Machielsen | |
| 7,412,835 B2 * | 8/2008 | Legall et al. | 62/6 |
| 2003/0052681 A1 | 3/2003 | Kono | |
| 2003/0206015 A1 | 11/2003 | Feiweier | |
| 2005/0109049 A1 | 5/2005 | Chan | |
| 2006/0288710 A1 | 12/2006 | Legall et al. | |

* cited by examiner

*Primary Examiner* — Brij Shrivastav

(57) ABSTRACT

A magnetic resonance examination system includes a main magnet with superconducting coils to generate a main magnetic field and a gradient system to apply a gradient magnetic field superposed on the main magnetic field. A cooling system cools the superconducting coils to below their critical superconductivity temperature. A transfer monitor assesses the transfer of energy from the gradient system to the cooling system. The transfer monitor is configured to measure pressure changes in the cooling system. This leads to a simple manner of evaluating the transfer of energy from the gradient coils into the cooling system.

3 Claims, 3 Drawing Sheets

MAGNETIC RESONANCE SYSTEM WITH COOLING SYSTEM AND MONITORING OF HELIUM PRESSURE

FIELD OF THE INVENTION

The invention pertains to a magnetic resonance examination system with superconducting coils to generate a main magnetic field. The magnetic resonance examination system also includes a gradient system to apply a magnetic gradient field superposed on the main magnetic field.

BACKGROUND OF THE INVENTION

Such a magnetic resonance examination system is known from the US-patent application U.S. 2003/0206015.

The known magnetic resonance examination system has a control unit which automatically determines system-specific acoustic and mechanical resonances. Resonant oscillations are caused by pulsed operation of the gradient coil. In particular, periodically repeated gradient pulses (i.e. pulsed gradient magnetic fields) cause a forced mechanical oscillation of the magnetic resonance examination system. These gradient pulses cause eddy currents in structures surrounding the gradient coil and due to interaction with the main magnetic field exert (Lorentz) forces to cause these structures to move. All structures that are mechanically coupled, move or vibrate due to these forces. When periodically repeated gradient pulses are applied, forced mechanical oscillation of the system can occur and resonant amplification occurs if excitation occurs at the natural resonant frequencies of the mechanically coupled structures. When the superconducting coils of the main magnet are excited to oscillate, then increased evaporation occurs of Helium that is employed to cool the superconducting coils below their superconducting critical temperature. The excitation of mechanical or acoustic resonances is dependent on the imaging sequences in which gradient pulses are switched. Based on these dependencies the imaging sequences can be limited so that an excitation of mechanical resonances no longer occurs. In the known magnetic resonance examination system this dependency is obtained by forming a resonance curve as a function of the time spacing of the gradient pulses.

SUMMARY OF THE INVENTION

An object of the invention is to provide a magnetic resonance examination system in which the transfer function that represents energy transfer from the gradient coil into the magnetic resonance examination system is determined simpler and more accurately.

This object is achieved in the magnetic resonance examination system comprising
  a main magnet with superconducting coils to generate a main magnetic field
  a gradient system to apply a gradient magnetic field superposed on the main magnetic field
  a cooling system to cool the superconducting coils to below their critical superconductivity temperature
  a transfer monitor to assess the transfer of energy from the gradient system to the cooling system,
  the transfer monitor being configured to measure pressure changes in the cooling system.

The gradient system includes one or more gradient coils which generate gradient magnetic fields when an electrical current is passed through the gradient coil windings. Notably switching of the gradient fields causes eddy currents by which energy is transferred from the gradient coils into the cooling system and notably into the cooling medium such as liquid Helium in the cooling system. The pressure changes in the cooling system are representative of the transfer of energy from the gradient system to the cooling system. Notably, when the cooling system includes a cryostat and a Helium vessel, from the pressure changes the transfer of energy from the gradient coil into the Helium (He) vessel can be accurately derived. Moreover, the pressure changes are easily measured.

The accurately determined transfer function can be employed to control the settings of acquisition sequences including switching of gradient pulses to avoid settings that are associated with a very efficient energy transfer from the gradient system. Thus, the acquisition sequences can be adapted so that the energy transfer is less. Consequently, when the adapted acquisition sequences are employed, dynamic boil-off of helium from the He-vessel is reduced and further the acoustic noise level is lower.

Accuracy of the transfer function also includes that according to the invention the transfer function represents most or even all energy transfer mechanisms between the gradient coil and the cooling system. Hence, the energy transfer more accurately represents the energy transfer and the ensuing He boil off as compared to taking only mechanical energy transfer mechanisms into account.

These and other aspects of the invention will be further elaborated with reference to the embodiments defined in the dependent Claims.

According to a further aspect of the invention in order to calibrate the energy transfer function, a test gradient magnetic field having a gradually increasing gradient strength is applied during pre-set active time intervals, alternated with the gradient magnetic field switched off during intervals between successive active time intervals. Then the pressure in the cooling system, notably in the He-vessel is measured during the test gradient field switched on and off, respectively. The transfer function is computed from the difference between measured pressures at gradient on and off. From the difference between measured pressures at gradient on and off, drift of the pressure due to other causes which are common for gradient on and off are eliminated and do not corrupt the computed transfer function.

Preferably, the test gradient field encompasses a wide range of excitation frequencies so that accurate results for the transfer function are obtained for most of the relevant frequencies involved. Typically, a wide range of frequencies from 100 Hz to 6 kHz is employed. Good results are obtained for active time intervals of about 20 ms which also repeated at about 20 ms intervals. The differential measurement avoids the need for long waiting time for the cooling system with the He-vessel to reach a stationary state during excitations. Typically, the cooling system has a response time of up to 20 minutes. The actual measurement over a number of active time intervals is much less. For each separate frequency (range) and individual (x,y, or z) gradient measurement of the transfer function takes only a few minutes. Thus, the transfer function for the entire frequency range and all three gradient directions can be obtained within a few hours. Thus, a full re-calibration of the transfer function can be done overnight when the magnetic resonance examination system is not needed in operation.

According to another aspect of the invention, the transfer monitor computes an expected He consumption from (i) the computed transfer function and (ii) a selected acquisition sequence including a particular gradient pulse train, i.e. a succession of pulsed gradient magnetic fields. The computed expected He-consumption for the selected acquisition sequence is presented to the operator, e.g. shown on a display included in the user interface of the magnetic resonance examination system. Thus, the operator is put in a position where he/she may take the expected He-consumption into account when considering a particular acquisition sequence or adapting the acquisition sequence before it is activated.

BRIEF DESCRIPTION OF THE DRAWINGS

These and other aspects of the invention will be elucidated with reference to the embodiments described hereinafter and with reference to the accompanying drawing wherein.

DETAILED DESCRIPTION OF THE PREFERRED EMBODIMENTS

Figure 1:
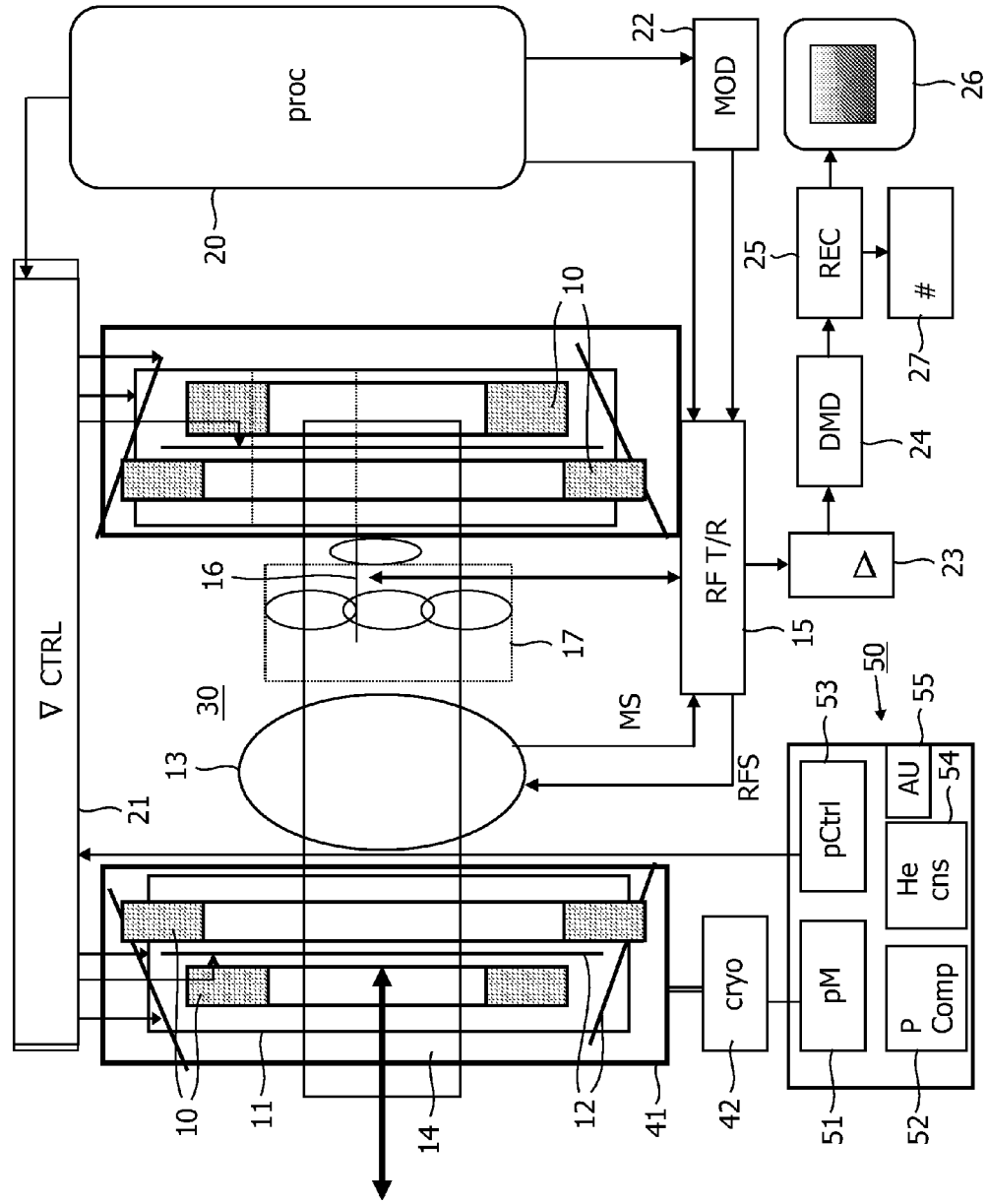
FIG. 1 shows diagrammatically a magnetic resonance imaging system in which the invention is used.

FIG. 1 shows diagrammatically a magnetic resonance imaging system in which the invention is used. The magnetic resonance imaging system includes a set of main magnet coils 10 whereby the steady, uniform magnetic field is generated. The main magnet coils are constructed, for example in such a manner that they enclose a tunnel-shaped examination space. The main magnet coils are superconducting. The windings of the superconducting main magnet coils are cooled to below the critical temperature by liquid Helium that is cooled to below its boiling point. The main magnet coils are enclosed in a He-vessel 41 that is filled with liquid He. A cryostat 42 is provided for cooling and liquefying the Helium. The patient to be examined is placed on a patient carrier 14 which is slid into this tunnel-shaped examination space 30. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a gradient control 21 which includes one or more gradient amplifiers and a controllable power supply unit. The gradient coils 11, 12 are energised by application of an electric current by means of the power supply unit 21; to this end the power supply unit is fitted with an electronic gradient amplification circuit that applies the electric current to the gradient coils so as to generate gradient pulses (also termed 'gradient waveforms') of appropriate temporal shape. The strength, direction and duration of the gradients are controlled by control of the power supply unit. The magnetic resonance imaging system also includes transmission and receiving coils 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is usually used alternately as the transmission coil and the receiving coil. Furthermore, the transmission and receiving coil is usually shaped as a coil, but other geometries where the transmission and receiving coil acts as a transmission and receiving antenna for RF electromagnetic signals are also feasible. The transmission and receiving coil 13 is connected to an electronic transmission and receiving circuit 15, which has a transmission and a receiver operating mode.

It is to be noted that it is alternatively possible to use separate receiving and/or transmission coils 16. For example, surface coils 16 can be used as receiving and/or transmission coils. Such surface coils have a high sensitivity in a comparatively small volume. The receiving coils, such as the surface coils, are connected to the electronic transmission and receiving circuit 15. The electronic transmission and receiving circuit is connected to a preamplifier 23. The received RF resonance signals are fed to a pre-amplifier 23 and then applied to a demodulator 24 and the received magnetic resonance signals (MS) are demodulated by means of the demodulator 24. The preamplifier 23 amplifies the RF resonance signal (MS) received by the receiving coil 16 and the amplified RF resonance signal is applied to the demodulator 24. The demodulator 24 demodulates the amplified RF resonance signal. The demodulated magnetic resonance signals (DMS) are applied to a reconstruction unit. The demodulated resonance signal contains the actual information concerning the local spin densities in the part of the object to be imaged.

Furthermore, the transmission and receiving circuit 15 is connected to a modulator 22. The modulator 22 and the transmission and receiving circuit 15 activate the transmission coil(s) 13,16 so as to transmit the RF excitation and refocusing pulses. Magnetic resonance signal data received by the surface coils 16 are transmitted to the transmission and receiving circuit 15 and control signals (e.g. to tune and detune the surface coils) are sent to the surface coils.

The reconstruction unit 25 derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction unit 25 is applied monitor 26, so that the monitor can display the magnetic resonance image. It is alternatively possible to store the signal from the reconstruction unit 25 in a buffer unit 27 while awaiting further processing.

The magnetic resonance imaging system is also provided with a control unit 20, for example in the form of a computer which includes a (micro)processor. The control unit 20 controls the execution of the RF excitations and the application of the temporary gradient fields. To this end, the computer program according to the invention is loaded, for example, into the control unit 20 and the reconstruction unit 25.

In accordance with the invention, the magnetic resonance examination system further comprises the transfer monitor 50. The transfer monitor includes a pressure monitor that measures pressure in the cryostat 42 or within the He-vessel which encloses the main magnet coils 10. The He-vessel filled with liquid Helium and the cryostat form the cooling system which cools the main magnet coils 10 to below their superconductivity critical temperature. In particular the pressure monitor 51 has a pressure sensor 511 which measures the pressure in the cryostat 42 and/or He-vessel and an electronic module that processes the pressure signal from the pressure sensor. Further, the pressure monitor is provided with a pressure controller 53. When in operation in a calibration mode of the magnetic resonance examination system the pressure controller drives the gradient control 21 to generate the test gradient magnetic fields. These test gradient magnetic fields are switched on and off for active time intervals of about 20 ms and separated by 20 ms periods in which no test gradient magnetic field is applied. A pressure comparator 52 circuit is provided to differentially measure pressure. To that end the output pressure signal of the pressure monitor 51 is applied to the pressure comparator 52. Differences are computed between pressure in the He-vessel and/or cryostat with and without test gradient magnetic field. From the differential measurement and the waveform of the test gradient magnetic field the transfer of energy from the gradient system to the cooling system is computed. The transfer characteristic that represents the energy transfer from the gradient system to the cooling system can be derived e.g. by an arithmetic unit 55 that is incorporated in the transfer monitor or by the (host) processor 20 of the magnetic resonance examination system.

When the magnetic resonance examination system is in operation to image a patient to be examined He-consumption occurs due to evaporation caused by deposited energy. On the basis of the transfer characteristic and actually applied gradient waveforms the He-consumption can be calculated and presented to the operator. To that end the transfer monitor is provided with a He-consumption display unit 54 that computes the expected He-consumption for a selected gradient waveform. In practice the He-consumption display unit is implemented as another window of view port in the user interface of the magnetic resonance examination system. Thus, the operator is provided with a simple insight in the amount of He that is lost for a MR acquisition sequence selected by the operator and that includes pr-determined gradient waveforms.

Figure 2:
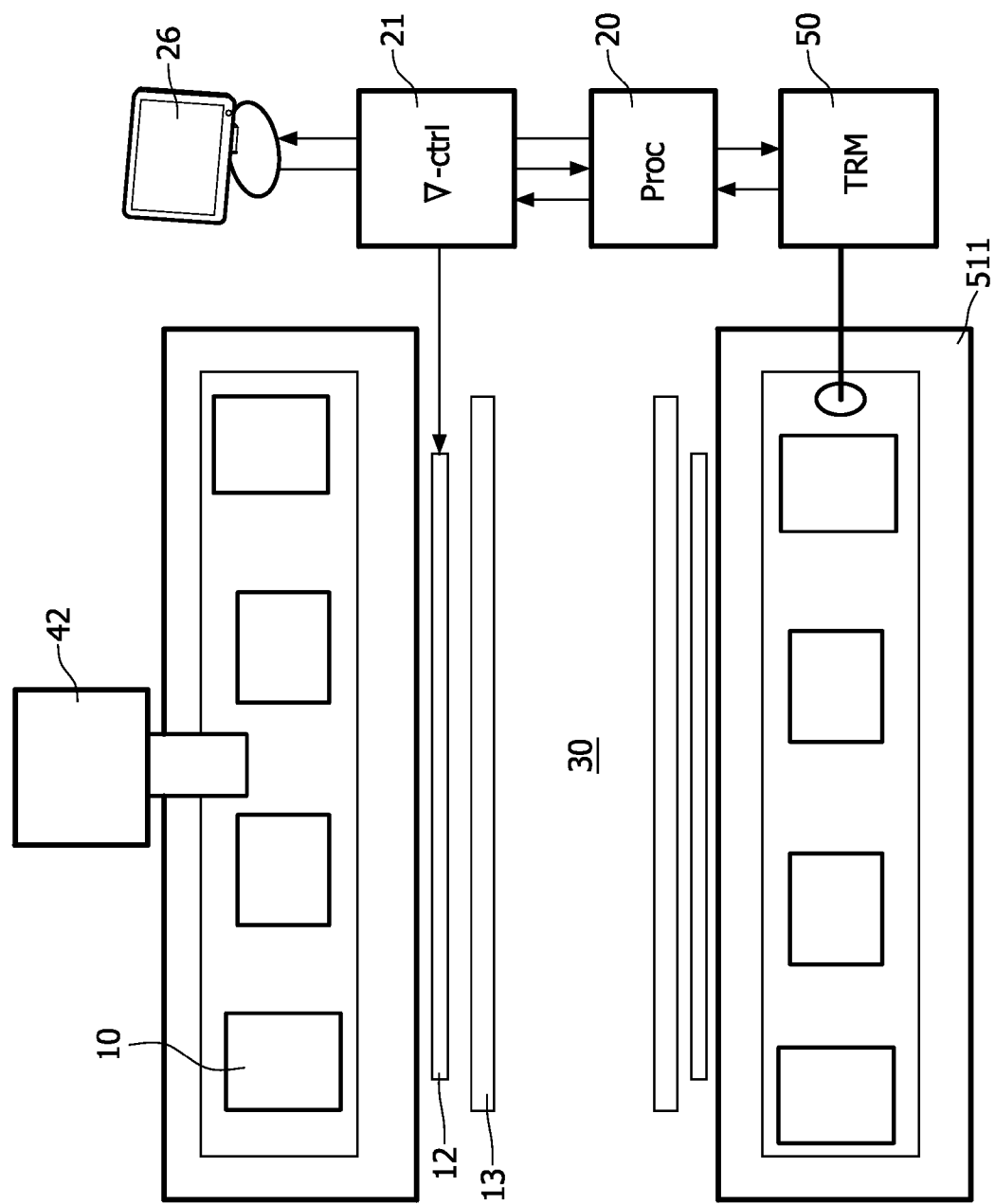
FIG. 2 shows another diagrammatic representation of the magnetic resonance examination system in which the present invention is incorporated.

FIG. 2 shows another diagrammatic representation of the magnetic resonance examination system in which the present invention is incorporated. FIG. 2 shows a cross sectional diagrammatic side elevation of the magnetic resonance examination system. The cross section is made along the longitudinal axis of the more or less cylindrically symmetric magnetic resonance examination system. The main magnet coils 10 are placed in the He-vessel 41. The He in the He-vessel is kept liquid by the cryostat 42 so that the main magnet coils are cooled at superconductive temperature. In the embodiment of FIG. 2, the pressure sensor 511 is located within the He-vessel and measures pressure in the He-vessel as a function of applied test gradient magnetic field.

Figure 3:
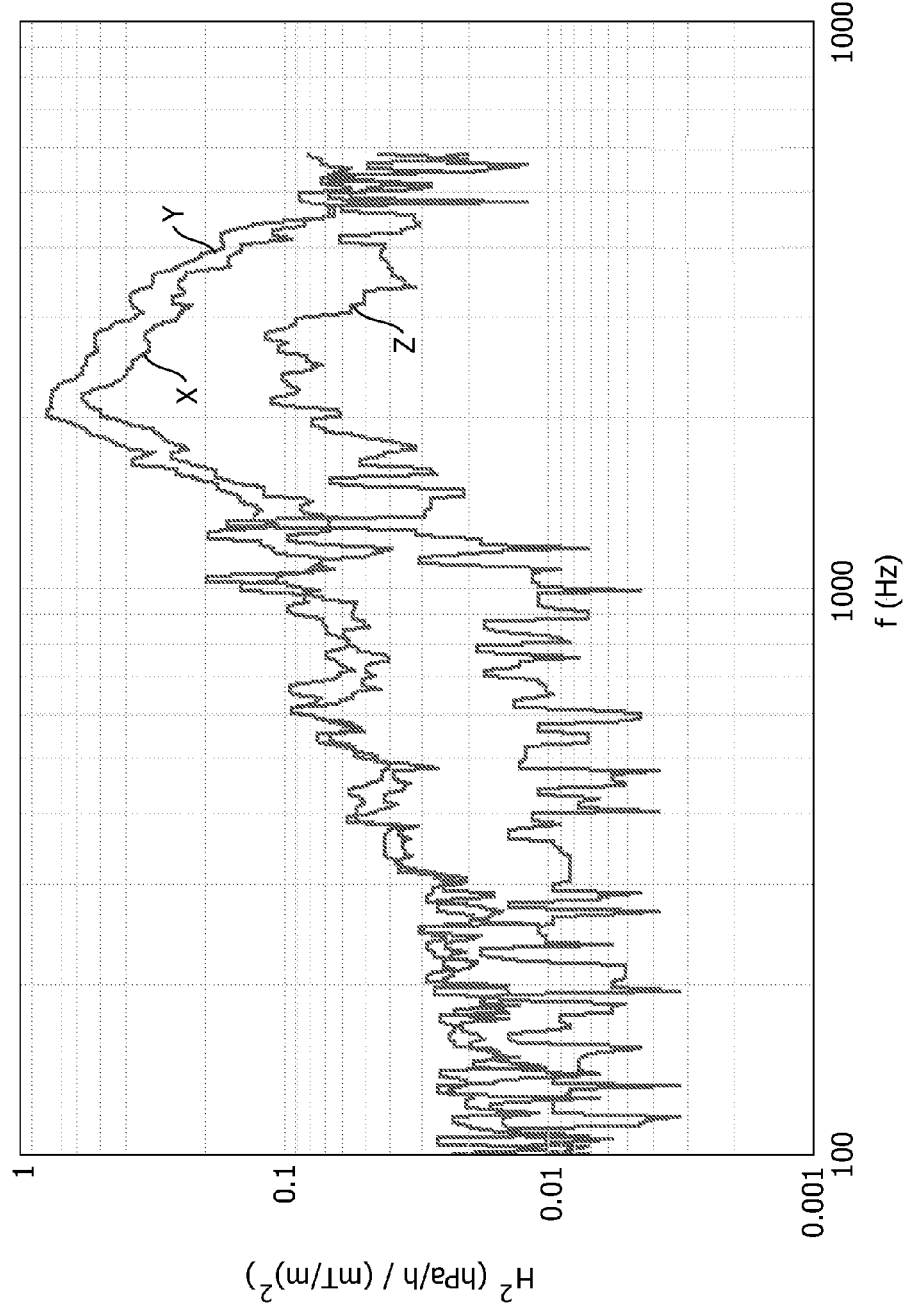
FIG. 3 shows experimental results for the transfer characteristic.

FIG. 3 shows experimental results for the transfer characteristic. The curves show the energy transfer as a function of waveform frequency for the x,y and z gradient coils, respectively. Notably, there is a marked reduction in energy (heat) transfer around 1 kHz. Thus, by adapting the MR acquisition sequence by adjusting the repetition time ($T_R$) to have waveform frequencies near a transfer minimum (e.g. near 1 kHz) heat transfer can be reduced without affecting the performance of the magnetic resonance examination system.

The invention claimed is:

1. A magnetic resonance examination system comprising:
    a main magnet with superconducting coils to generate a main magnetic field;
    a gradient system to apply a gradient magnetic field superposed on the main magnetic field;
    a cooling system to cool the superconducting coils to below their critical superconductivity temperatures; and
    a transfer monitor configured to measure pressure changes in the cooling system for reducing a transfer of energy from the gradient system to the cooling system based on the measured pressure changes.

2. A magnetic resonance examination system comprising:
    a main magnet with superconducting coils to generate a main magnetic field;
    a gradient system to apply a gradient magnetic field superposed on the main magnetic field;
    a cooling system to cool the superconducting coils to below their critical superconductivity temperatures; and
    a transfer monitor configured to measure pressure changes in the cooling system for assessing a transfer of energy from the gradient system to the cooling system based on the measured pressure changes,
    wherein the transfer monitor is further configured:
        to control the gradient system to generate a test gradient magnetic field having a gradually increasing gradient strength; and
        to assess the transfer of energy by comparing pressure in the cooling system during application of the test magnetic gradient field to pressure when no magnetic gradient field is applied.

3. A magnetic resonance examination system comprising:
    a main magnet with superconducting coils to generate a main magnetic field;
    a gradient system to apply a gradient magnetic field superimposed on the main magnetic field;
    a cooling system to cool the superconducting coils to below their critical superconductivity temperatures; and
    a transfer monitor configured to measure pressure changes in the cooling system for assessing a transfer of energy from the gradient system to the cooling system based on the measured pressure changes,
    wherein the transfer monitor is
        further configured, upon selection of a gradient pulse train, to
        compute an expected helium consumption from the transfer of energy in dependence of the gradient pulse train.

* * * * *